(12) United States Patent
Su et al.

(10) Patent No.: US 12,490,420 B2
(45) Date of Patent: Dec. 2, 2025

(54) SEMICONDUCTOR STRUCTURE AND MANUFACTURING METHOD THEREFOR, AND MEMORY

(71) Applicant: CHANGXIN MEMORY TECHNOLOGIES, INC., Hefei (CN)

(72) Inventors: Xingsong Su, Hefei (CN); Weiping Bai, Hefei (CN); Deyuan Xiao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 609 days.

(21) Appl. No.: 17/805,775

(22) Filed: Jun. 7, 2022

(65) Prior Publication Data

US 2023/0328954 A1  Oct. 12, 2023

Related U.S. Application Data

(63) Continuation of application No. PCT/CN2022/086612, filed on Apr. 13, 2022.

(30) Foreign Application Priority Data

Mar. 23, 2022  (CN) .......................... 202210289743.X

(51) Int. Cl.
| | | |
|---|---|---|
| H10B 12/00 | (2023.01) | |
| H01L 23/48 | (2006.01) | |
| H01L 23/528 | (2006.01) | |

(52) U.S. Cl.
CPC ......... *H10B 12/0335* (2023.02); *H10B 12/09* (2023.02); *H10B 12/482* (2023.02); *H10B 12/488* (2023.02)

(58) Field of Classification Search
CPC .. H10B 12/0335; H10B 12/09; H10B 12/482; H10B 12/488; H10B 12/03; H10B 12/05;
(Continued)

(56) References Cited

U.S. PATENT DOCUMENTS

| | | | |
|---|---|---|---|
| 9,219,005 B2 | 12/2015 | Or-Bach | |
| 9,449,986 B1 | 9/2016 | Yoon | |

(Continued)

FOREIGN PATENT DOCUMENTS

| | | |
|---|---|---|
| CN | 107665895 A | 2/2018 |
| CN | 109524417 A | 3/2019 |

(Continued)

OTHER PUBLICATIONS

JP first office action in application No. 2023-571633, mailed on Oct. 29, 2024.

(Continued)

*Primary Examiner* — Yara B Green
*Assistant Examiner* — Akhee Sarker-Nag
(74) *Attorney, Agent, or Firm* — Syncoda LLC; Feng Ma

(57) ABSTRACT

A semiconductor structure includes a substrate and a conductive structure located above the substrate. The conductive structure includes a plurality of first conductive structures and second conductive structures that are spaced apart from each other and extend in a first direction. Lengths of the first conductive structures and lengths of the second conductive structures vary in steps. The lengths of the plurality of first conductive structures and the lengths of the plurality (Continued)

of second conductive structures vary in steps. The first conductive structures and the second conductive structures form Word Lines (WLs).

13 Claims, 5 Drawing Sheets

(58) Field of Classification Search
CPC ... H10B 12/315; H01L 23/481; H01L 23/528; H01L 23/5283
See application file for complete search history.

(56) References Cited

U.S. PATENT DOCUMENTS

| | | | |
|---|---|---|---|
| 2011/0220987 A1* | 9/2011 | Tanaka | H10B 43/50 257/E21.409 |
| 2013/0020707 A1 | 1/2013 | Or-Bach et al. | |
| 2015/0137216 A1* | 5/2015 | Lee | H10D 30/0411 257/329 |
| 2018/0033799 A1 | 2/2018 | Kanamori | |
| 2021/0159229 A1* | 5/2021 | Gomes | H10D 62/121 |
| 2021/0384210 A1* | 12/2021 | Jo | H10B 43/40 |
| 2022/0020767 A1 | 1/2022 | Lim | |
| 2022/0231140 A1* | 7/2022 | Kim | H10D 64/037 |

FOREIGN PATENT DOCUMENTS

| | | |
|---|---|---|
| CN | 111106122 A | 5/2020 |
| CN | 112466881 A | 3/2021 |
| CN | 114023703 A | 2/2022 |
| CN | 114023756 A | 2/2022 |
| EP | 3826058 A1 | 5/2021 |
| JP | 2011187794 A | 9/2011 |
| JP | 2014042029 A | 3/2014 |
| KR | 20070038233 A | 4/2007 |
| KR | 20170042449 A | 4/2017 |
| TW | 202129923 A | 8/2021 |
| TW | 202143455 A | 11/2021 |
| TW | 753749 B | 1/2022 |
| TW | 202209314 A | 3/2022 |

OTHER PUBLICATIONS

KR office action in application No. 10-2023-7019998, mailed on Jun. 26, 2024.

* cited by examiner

SEMICONDUCTOR STRUCTURE AND MANUFACTURING METHOD THEREFOR, AND MEMORY

CROSS-REFERENCE TO RELATED APPLICATIONS

This application is a continuation application of International Patent Application No. PCT/CN2022/086612 filed on Apr. 13, 2022, which claims priority to Chinese Patent Application No. 202210289743.X filed on Mar. 23, 2022. The disclosures of these applications are hereby incorporated by reference in their entirety.

BACKGROUND

With the development of a semiconductor technology, memories, especially Dynamic Random Access Memories (DRAMs) are widely applied to various electronic devices as the memories have high storage density and fast read-write speed.

The DRAM usually includes a plurality of storage units. Each storage unit includes a transistor and a capacitor. A gate of the transistor is electrically connected to a Word Line (WL) of the DRAM, and the turn-on and turn-off of the transistor are controlled by means of voltage on the WL. A source/drain of the transistor is electrically connected to a Bit Line (BL), and is electrically connected to the capacitor. Data information is outputted by using the BL.

In order to further decrease a size of the memory and increase storage density, the capacitor is generally horizontally placed, so as to manufacture a capacitor having a larger slenderness ratio. However, the manufacturing difficulty of the memory is relatively large.

SUMMARY

The disclosure relates to the technical field of semiconductors, and in particular, to a semiconductor structure and a manufacturing method therefor, and a memory.

According to some embodiments, a first aspect of the disclosure provides a semiconductor structure. The semiconductor structure includes a substrate and a conductive structure located above the substrate. The conductive structure includes a plurality of first conductive structures and second conductive structures that are spaced apart from each other and extend in a first direction. Lengths of the first conductive structures vary in steps and lengths of the second conductive structures vary in steps.

According to some embodiments, a second aspect of the disclosure provides a memory. The memory includes: a substrate, including a device area; a device layer, located above the device area and including a plurality of channel structures spaced apart from each other; a WL structure, including a plurality of WLs spaced apart from each other and extending in a first direction, where lengths of the plurality of WLs vary in steps; a bit line (BL) structure, including a plurality of BLs spaced apart from each other and extending in a second direction. The WLs penetrate the device layer and surround the channel structures. The BLs penetrate the device layer and are electrically connected to the channel structures. The channel structures are further electrically connected to storage nodes.

According to some embodiments, a third aspect of the disclosure provides a method for manufacturing a semiconductor structure. The method includes the following operations. A substrate is provided. A conductive structure is formed above the substrate, and includes a plurality of first conductive structures and second conductive structures that are spaced apart from each other and extend in a first direction. Lengths of the first conductive structures and lengths of the second conductive structures vary in steps.

DETAILED DESCRIPTION

In some implementations, in order to further increase the storage capacity of a memory, a capacitor is generally horizontally placed, that is, an extending direction of the capacitor is parallel to a substrate, so as to manufacture the capacitor. When the capacitor is horizontally placed, both a BL structure and a WL structure matching the capacitor need to be re-arranged, so that the manufacturing difficulty of the memory is relatively large.

In view of this, according to the semiconductor structure and the manufacturing method therefor, and the memory provided in the disclosure, the plurality of first conductive structures and the plurality of second conductive structures are arranged above the substrate, and the lengths of the plurality of first conductive structures and the lengths of the plurality of second conductive structures vary in steps. The first conductive structures and the second conductive structures form the WLs. The WLs are easy to manufacture and lead out, so that other structures are conveniently formed on the WLs, so as to achieve an electrical connection between the WLs and a peripheral circuit.

In order to make the above purposes, features and advantages of the embodiments of the disclosure more obvious and easy to understand, the technical solutions in the embodiments of the disclosure will be clearly and completely described below with reference to the drawings in the embodiments of the disclosure. It is apparent that the embodiments described herein are only a part of the embodiments of the disclosure, rather than all of the embodiments. Based on the embodiments in the disclosure, all other embodiments obtained by those of ordinary skilled in the art without creative work shall fall within the protection scope of the disclosure.

Figure 1:
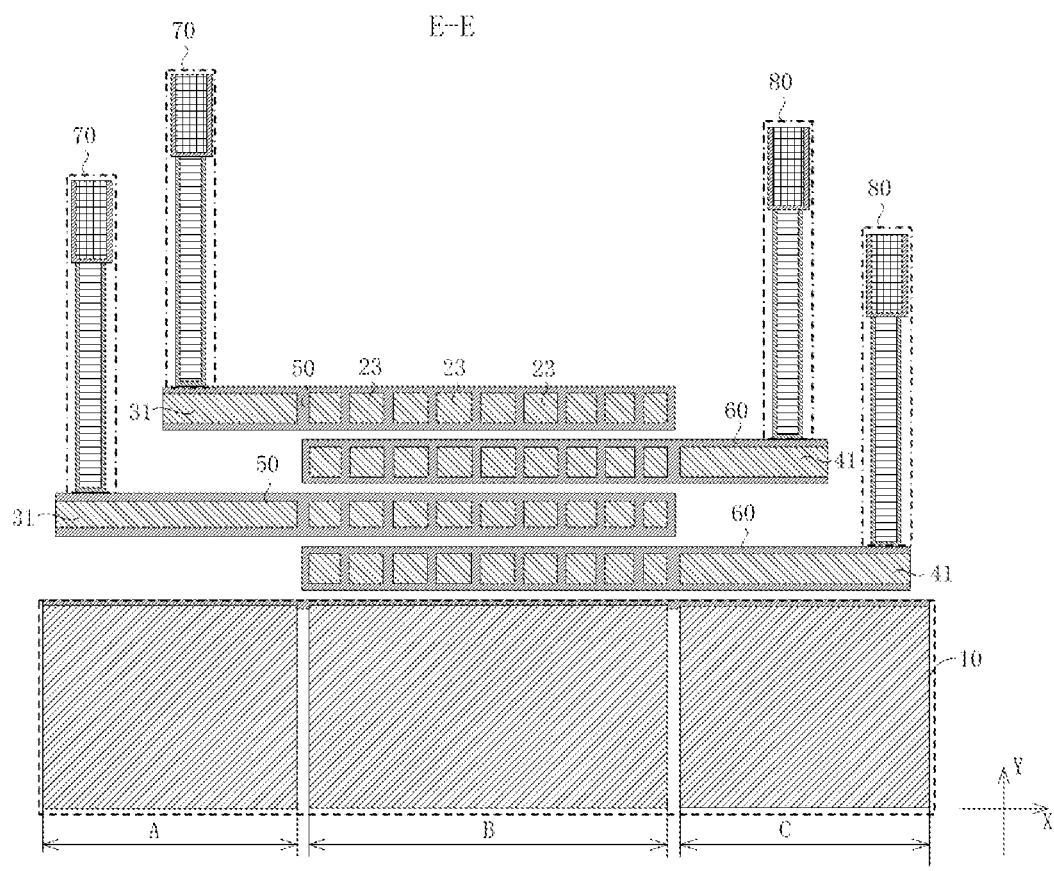
FIG. 1 is a schematic structural diagram of a semiconductor structure according to an embodiment of the disclosure.

Referring to FIG. 1, a first aspect of the disclosure provides a semiconductor structure. The semiconductor structure includes a substrate 10 and a conductive structure located above the substrate 10. A material of the substrate 10 may be a semiconductor. For example, the material of the substrate 10 may be monocrystalline silicon, polycrystalline silicon, amorphous silicon, germanium, silicon carbide, silicon germanium, a Germanium on Insulator (GOI), or a Silicon on Insulator (SOI), or other materials known to those skilled in the art.

Continuously referring to FIG. 1, the conductive structure includes a plurality of first conductive structures 50 and a plurality of second conductive structures 60 that are spaced apart from each other. The plurality of first conductive structures 50 and the plurality of second conductive structures 60 extend in the first direction. Lengths of the plurality of first conductive structures 50 and lengths of the plurality of second conductive structures 60 vary in steps.

The above "plurality of first conductive structures 50 and the plurality of second conductive structures 60 that are spaced apart from each other" means that the plurality of first conductive structures 50 and the plurality of second conductive structures 60 are stacked in the second direction; and the plurality of first conductive structures 50 are spaced apart from each other, the plurality of second conductive structures are spaced apart from each other, and the first conductive structures 50 and the second conductive structures 60 are spaced apart from each other, so that insulated isolation between each first conductive structure 50 and each second conductive structure 60 is guaranteed. The second direction may intersect with the first direction. Preferably, the second direction is perpendicular to the first direction, so that the plurality of first conductive structures 50 and the plurality of second conductive structures 60 are arranged more tightly. Exemplarily, the first direction is a direction (an X direction shown in FIG. 1) parallel to the substrate 10, and the second direction is a direction (a Y direction shown in FIG. 1) perpendicular to the substrate 10.

Through such an arrangement, the lengths of the plurality of first conductive structures 50 and the lengths of the plurality of second conductive structures 60 vary in steps. The first conductive structures 50 and the second conductive structures 60 form WLs, so that each WL has a leading-out end. The WLs are easy to manufacture and lead out, and other structures are conveniently formed on the WLs, so as to achieve an electrical connection between the WLs and a peripheral circuit.

Specifically, orthographic projections of the plurality of first conductive structures 50 and the plurality of second conductive structures 60 on the substrate 10 have partially coincident areas. At least one first conductive structure 50 is located between the plurality of second conductive structures 60, or at least one second conductive structure 60 is located between the plurality of first conductive structures 50, so that the plurality of first conductive structures 50 and the plurality of second conductive structures 60 are stacked. Through such an arrangement, space above the substrate 10 may be fully utilized, and leading-out ends of the first conductive structures 50 and the second conductive structures 60 may be uniformly distributed.

Preferably, the plurality of first conductive structures 50 and the plurality of second conductive structures 60 are successively and alternately arranged and spaced apart from each other in the second direction. That is to say, one second conductive structure 60 is arranged between every two adjacent first conductive structures 50, or one first conductive structure 50 is arranged between every two adjacent second conductive structures 60. Through such an arrangement, in the second direction, a distance between two adjacent first conductive structures 50 approximately same as a distance between two adjacent second conductive structures 60, so that the leading-out ends of the first conductive structures 50 and the leading-out ends of the second conductive structures 60 are distributed more uniformly. In this way, the first conductive structures 50 are approximately symmetrical to the second conductive structures 60, so as to fully utilize the space above the substrate 10.

Continuously referring to FIG. 1, the plurality of first conductive structures 50 extend in the first direction, and the lengths of the plurality of first conductive structures 50 vary in steps. The plurality of second conductive structures 60 extend in the first direction, and lengths of the plurality of second conductive structures 60 vary in steps. Through such an arrangement, each first conductive structure 50 and each second conductive structure 60 are partially exposed. The parts may be used as the leading-out ends of the first conductive structure 50 and each second conductive structure 60, so as to conveniently lead out each first conductive structure 50 and each second conductive structure 60 to connect to the peripheral circuit.

In a possible implementation, the lengths of the first conductive structures 50 close to the substrate 10 is greater than the lengths of the first conductive structures 50 away from the substrate 10, such that the lengths of the plurality of first conductive structures 50 vary in steps. The lengths of the second conductive structures 60 close to the substrate 10 is greater than the lengths of the second conductive structures 60 away from the substrate 10, such that the lengths of the plurality of second conductive structures 60 vary in steps.

Specifically, in a direction away from the substrate 10, the lengths of the plurality of first conductive structures 50 in the first direction are successively decreased, such that the parts of the plurality of first conductive structures 50 away from the second conductive structures 60 vary in steps. As shown in FIG. 1, left ends of the plurality of first conductive structures 50 form steps. The lengths of the plurality of second conductive structures 60 in the first direction are successively decreased, such that the parts of the plurality of second conductive structures 60 away from the first conductive structures 50 vary in steps. As shown in FIG. 1, right ends of the plurality of second conductive structures 60 form steps. Ends of each first conductive structure 50 and each second conductive structure 60 away from each other are partially exposed. The ends are away from the channel structures 23 in the middle of the substrate 10, which are large in manufacturing space and small in interference to the channel structures 23.

In a possible implementation, the substrate 10 includes a device area, and a first connection area and a second connection area that are respectively arranged on two sides of the device area. A semiconductor device, for example, a transistor, is arranged in the device area. Both the first connection area and the second connection area are configured to lead out the semiconductor device in the device area, so that the semiconductor device is electrically connected to the peripheral circuit.

The first connection area and the second connection area may be arranged on two opposite sides of the device area. Exemplarily, the first connection area, the device area, and the second connection area are successively arranged in the first direction. The first direction is a horizontal direction (X direction) shown in FIG. 1. The first connection area is shown at A in FIG. 1. The device area is shown at B in FIG. 1. The second connection area is shown at C in FIG. 1. The first connection area is located on a left side of the device area, and the second connection area is located on a right side of the device area.

In some possible examples, the substrate 10 in the device area, the substrate 10 in the first connection area, and the substrate 10 in the second connection area are integrated. That is to say, the substrate 10 in the device area, the substrate 10 in the first connection area, and the substrate 10 in the second connection area are connected to each other. In some other examples, the substrate 10 in the first connection area and/or the substrate 10 in the second connection area and the substrate 10 in the device area are spaced apart from each other. That is to say, there is a gap between at least one of the substrate 10 in the first connection area and the substrate 10 in the second connection area and the substrate 10 in the device area. Preferably, the substrate 10 in the first connection area, the substrate 10 in the second connection area, and the substrate 10 in the device area are spaced apart from each other, so that the substrate 10 is provided, and required structures are respectively formed on the substrate 10 later.

On the basis of the above embodiments, that is, on the basis that the substrate 10 includes the device area, and the first connection area and the second connection area that are respectively arranged on the two sides of the device area, in some possible implementations, the first conductive structures 50 are located above the device area and extend to the first connection area, and the second conductive structures 60 are located above the device area and extend to the second connection area. The lengths of the first conductive structures 50 located above the first connection area vary in steps, and the lengths of the second conductive structures 60 located above the second connection area vary in steps.

As shown in FIG. 1, the first conductive structures 50 are arranged above the device area and above the first connection area. The second conductive structures 60 are arranged above the device area and above the second connection area. The lengths of the first conductive structures 50 located above the first connection area vary in steps, so that the first conductive structures 50 located above the first connection area form first steps, and the first conductive structures 50 are led out by means of step surfaces of the first steps. The lengths of the second conductive structures 60 located above the second connection area vary in steps, so that the second conductive structures 60 located above the second connection area form second steps, and the second conductive structures 60 are led out by means of step surfaces of the second steps.

In some possible embodiments, a plurality of channel structures 23 spaced apart from each other are arranged in the device area. Each first conductive structure 50 and each second conductive structure 60 located above the device area surround the plurality of channel structures 23 are spaced apart from each other. Dielectric layers are arranged between the first conductive structure 50 and the channel structures 23, and between the second conductive structure 60 and the channel structures 23.

As shown in FIG. 1, there may be a plurality of channel structures 23. The plurality of channel structures 23 are arranged in arrays. The plurality of channel structures 23 are not only spaced in the first direction, but also spaced in the second direction. Each channel structure 23 extends in a third direction. The first direction and the second direction intersect with each other, and are perpendicular to the third direction. In the embodiments of the disclosure, the first direction and the second direction are perpendicular to each other. Such an arrangement may cause the channel structures 23 to be arranged more compact, so that the arrangement mode is better. Therefore, the arrangement number of the channel structures 23 is maximized, and the storage density of the semiconductor structure is enhanced. Definitely, in the embodiments of the disclosure, an included angle between the first direction and the second direction is not limited, and a user may select according to actual situations.

Specifically, two ends of each channel structure 23 are respectively provided with a source and a drain. An active column is formed by the source, the channel structure 23, and the drain. The source, the channel structure 23, and the drain are successively stacked in the third direction. That is to say, an extending direction of the active column is the third direction. A subsequently formed transistor is placed in the third direction. The third direction is parallel to the substrate 10. A shape of the active column may be a cylinder, a prism, a cuboid, or other shapes, which is not limited in the embodiments of the disclosure, and the user may select according to actual situations.

Each first conductive structure 50 located above the device area surrounds the plurality of channel structures 23 spaced apart from each other, and each second conductive structure 60 located above the device area surrounds the plurality of channel structures 23 spaced apart from each other. Both the first conductive structure 50 and the second conductive structure 60 located above the device area form gates. The dielectric layer (not shown in the figure) is arranged between the first conductive structure 50 and the channel structures 23, and the dielectric layer is arranged between the second conductive structure 60 and the channel structures 23. A Gate All Around (GAA) transistor is formed by the gates, the dielectric layers, and the active columns. Compared with a planar transistor, a feature size of the GAA transistor is smaller, in a case that a same substrate 10 area is occupied, the integration level of the semiconductor structure can be effectively enhanced, and storage capacity can be increased.

Continuously referring to FIG. 1, each first conductive structure 50 located above the first connection area surrounds a first active layer 31, and a first insulation layer (not shown in the figure) is arranged between the first conductive structure 50 and the first active layer 31. Each second conductive structure 60 located above the second connection area surrounds a second active layer 41, and a second insulation layer (not shown in the figure) is arranged between the second conductive structure 60 and the second active layer 41.

Each first conductive structure 50 located above the first connection area is configured to lead out the corresponding gates above the device area. Each second conductive structure 60 located above the second connection area is configured to lead out the corresponding gates in the device area. That is to say, the gates of the transistor above the device area are respectively led out by using the first conductive structures 50 in the first connection area and the second conductive structures 60 in the second connection area, to connect to the peripheral circuit.

Specifically, each first conductive structure 50 located above the first connection area surrounds the first active layer 31. The first active layer 31 may be used as a supporting layer of the first conductive structure 50, so as to form the first conductive structure 50 thereon. The first insulation layer is arranged between the first conductive structure 50 and the first active layer 31. A material of the first insulation layer may be the same as a material of the dielectric layer, so that the first insulation layer and the dielectric layer are simultaneously formed. In this way, the first conductive structure 50 above the first connection area and the first conductive structure 50 above the device area are simultaneously formed. Therefore, a process of manufacturing the semiconductor structure can be simplified.

Each second conductive structure 60 located above the second connection area surrounds the second active layer 41. The second active layer 41 may be used as a supporting layer of the second conductive structure 60, so as to form the second conductive structure 60 thereon. The second insulation layer is arranged between the second conductive structure 60 and the second active layer 41. A material of the second insulation layer may be the same as a material of the dielectric layer, so that the second insulation layer and the dielectric layer are simultaneously formed. In this way, the second conductive structure 60 above the second connection area and the second conductive structure 60 above the device area are simultaneously formed. Therefore, a process of manufacturing the semiconductor structure can be simplified.

Further, the first insulation layer, the second insulation layer, and the dielectric layer have a same material, so that each first conductive structure 50 and each second conductive structure 60 are simultaneously formed. Therefore, a process of manufacturing the semiconductor structure can be further simplified. The materials of the first insulation layer, the second insulation layer, and the dielectric layer may be oxide, such as silicon oxide, hafnium oxide, or zirconium oxide.

In some possible embodiments, the first active layer 31 corresponding to the same first conductive structure 50 and the plurality of channel structures 23 are arranged at a same layer. The second active layer 41 corresponding to the same second conductive structure 60 and the plurality of channel structures 23 are arranged at a same layer.

As shown in FIG. 1, each first conductive structure 50 located above the device area surrounds the plurality of channel structures 23 spaced apart from each other, and each first conductive structure 50 located above the first connection area surrounds the first active layer 31. The first active layer 31 corresponding to the same first conductive structure 50 and the plurality of channel structures 23 are arranged at the same layer, so that more optimized arrangement of the first conductive structure 50 is achieved, space occupation is smaller, and the first conductive structure 50 is more uniform in thickness and better in flatness.

Similarly, each second conductive structure 60 located above the device area surrounds the plurality of channel structures 23 spaced apart from each other, and each second conductive structure 60 located above the second connection area surrounds the second active layer 41. The second active layer 41 corresponding to the same second conductive structure 60 and the plurality of channel structures 23 are arranged at the same layer, so that more optimized arrangement of the second conductive structure 60 is achieved, space occupation is smaller, and the second conductive structure 60 is more uniform in thickness and better in flatness.

Continuously referring to FIG. 1, the semiconductor structure further includes a plurality of contact plugs spaced apart from each other. The contact plugs include first contact plugs 70 and second contact plugs 80. A plurality of first contact plugs 70 are in one-to-one correspondence with and electrically connected to the plurality of first conductive structures 50. A plurality of second contact plugs 80 are in one-to-one correspondence with and electrically connected to the plurality of second conductive structures 60. The plurality of contact plugs are configured to electrically connect the first conductive structures 50 and the second conductive structures 60 to the peripheral circuit. The plurality of contact plugs are spaced apart from each other, to guarantee insulated isolation among the plurality of contact plugs. Therefore, mutual interference between the first conductive structures 50 or between the second conductive structures 60 is avoided.

Specifically, the contact plugs include the first contact plugs 70 and the second contact plugs 80. The number of the first contact plugs 70 matches the number of the first conductive structures 50, so that the plurality of first contact plugs 70 are in one-to-one correspondence with and electrically connected to the plurality of first conductive structures 50. Therefore, each first conductive structure 50 may be electrically connected to the peripheral circuit, and the transistor corresponding to the first conductive structure 50 is controlled by using the peripheral circuit. The number of the second contact plugs 80 matches the number of the second conductive structures 60, so that the plurality of second contact plugs 80 are in one-to-one correspondence with and electrically connected to the plurality of second conductive structures 60. Therefore, each second conductive structure 60 may be electrically connected to the peripheral circuit, and the transistor corresponding to the second conductive structure 60 is controlled by using the peripheral circuit.

Exemplarily, each first conductive structure 50 and each second conductive structure 60 have first surfaces and second surfaces that are arranged opposite to each other. The first surfaces are sides away from the substrate 10, and the second surfaces are sides close to the substrate 10. The first contact plugs 70 are in contact with the first surfaces of the first conductive structures 50, and the second contact plugs 80 are in contact with the first surfaces of the second conductive structures 60.

As shown in FIG. 1, the plurality of first contact plugs 70 and the plurality of second contact plugs 80 extend in the second direction. Lengths of the plurality of first contact plugs 70 and lengths of the plurality of second contact plugs 80 vary in steps. The plurality of first contact plugs 70 may be arranged in the first direction, and the plurality of second contact plugs 80 may be arranged in the first direction. Through such an arrangement, the plurality of first contact plugs 70 and the plurality of second contact plugs 80 are smaller in space occupation, so that the number of transistors are increased, thereby increasing the storage density of the semiconductor structure. Preferably, the plurality of first contact plugs 70 and the plurality of second contact plugs 80 are located in a same row in the first direction, to further reduce space occupied by the plurality of first contact plugs 70 and the plurality of second contact plugs 80.

The lengths of the plurality of first contact plugs 70 vary in steps, and the lengths of the plurality of second contact plugs 80 vary in steps. A length direction is the second direction. Through such an arrangement, the lengths of the plurality of first contact plugs 70 are approximately the same as the lengths of the plurality of second contact plugs 80. A path between the peripheral circuit and the first conductive structure 50, and between the peripheral circuit and the second conductive structure 60 are approximately the same. Therefore, a difference in the working condition of each transistor in the device area is relatively small.

Continuously referring to FIG. 1, the first contact plugs 70 and the second contact plugs 80 include first conductive portions and second conductive portions arranged on the first conductive portions, and sizes of the first conductive portions are less than sizes of the second conductive portions. The first conductive portions are portions close to the substrate 10, and the second conductive portions are portions away from the substrate 10. That is to say, the second conductive portions are located on sides of the first conductive portions away from the substrate 10. The first conductive portions of the first contact plugs 70 are in contact with the first conductive structures 50. The first conductive portions of the second contact plugs 80 are in contact with the second conductive structures 60. The sizes of the first conductive portions may refer to diameters or cross-sectional areas of the first conductive portions. The sizes of the second conductive portions may refer to diameters or cross-sectional areas of the second conductive portions. As shown in FIG. 1, orthographic projections of the second conductive portions on the substrate 10 cover orthographic projections of the first conductive portions on the substrate 10.

The first conductive portions and the second conductive portions may include core layers and outer layers covering side surfaces and bottom surfaces of the core layers. The core layers may be insulation layers, and a material of the core layers may be silicon nitride or silicon oxide. The outer layers may be metal layers, and a material of the outer layers may be tungsten or titanium nitride. Through such an arrangement, on the basis of guaranteeing the electric performance of the first conductive portions and the second conductive portions, thicknesses of the metal layers are decreased, so as to reduce costs.

To sum up, in the semiconductor structure provided in the embodiments of the disclosure, the plurality of first conductive structures 50 and the plurality of second conductive structures 60 are arranged above the substrate 10. The plurality of first conductive structures 50 and the plurality of second conductive structures 60 extend in the first direction. The plurality of first conductive structures 50, the plurality of second conductive structures 60, and the first conductive structures 50 and the second conductive structures are spaced apart from each other, so as to achieve insulated isolation. The lengths of the plurality of first conductive structures 50 and the lengths of the plurality of second conductive structures 60 vary in steps. The first conductive structures 50 and the second conductive structures 60 form WLs. The WLs are easy to manufacture and lead out, so that other structures are conveniently formed on the WLs, so as to achieve an electrical connection between the WLs and the peripheral circuit.

Figure 2:
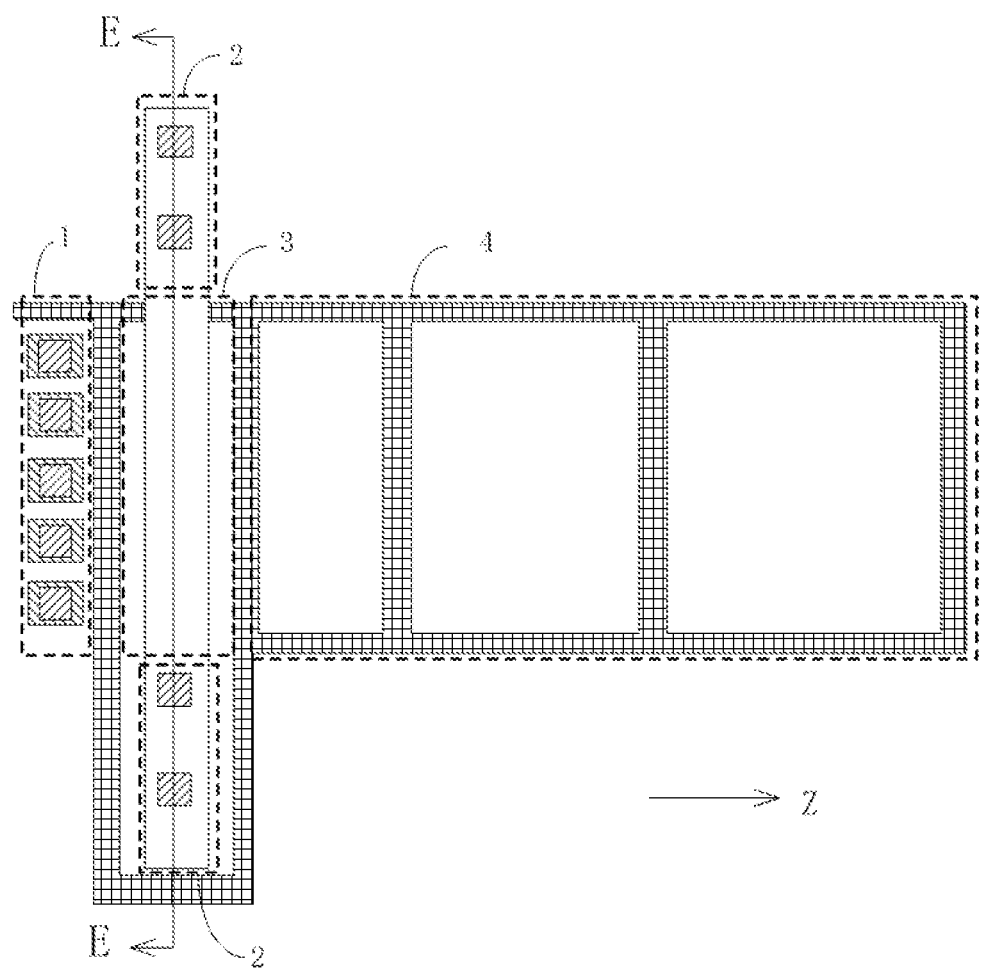
FIG. 2 is an architecture diagram of a memory according to an embodiment of the disclosure.

Referring to FIG. 1 and FIG. 2, an embodiment of the disclosure further provides a memory. The memory may include, for example, a Dynamic Random Access Memory (DRAM), a Static Random Access Memory (SRAM), a flash memory, an Electrically Erasable Programmable Read-Only Memory (EEPROM), a Phase Change Random Access Memory (PRAM), or a Magneto-resistive Random Access Memory (MRAM). In this embodiment of the disclosure, the DRAM is used as an example for description.

As shown in FIG. 1 and FIG. 2, the memory includes a substrate 10, a device layer, a WL structure 2, and a BL structure 1. A material of the substrate 10 may be a semiconductor substrate. For example, the material of the substrate 10 may be monocrystalline silicon, polycrystalline silicon, amorphous silicon, germanium, silicon carbide, silicon germanium, a GOI, or an SOI.

The substrate 10 includes a device area. The device layer is arranged above the device area, and includes a plurality of channel structures 23 spaced apart from each other. In some possible embodiments, the substrate 10 further includes a first connection area and a second connection area. The device area is located between the first connection area and the second connection area. The first connection area and the second connection area are configured to lead out the WL structure 2. Exemplarily, the first connection area, the device area, and the second connection area are successively arranged in the first direction. The substrate 10 in the device area and the substrates 10 in the first connection area and the second connection area are spaced apart from each other, so that the substrate 10 is provided, and required structures are respectively formed on the substrate 10.

The plurality of channel structures 23 are arranged in arrays. The plurality of channel structures 23 are not only spaced in the first direction, but also spaced in the second direction, and extend in a third direction. The first direction (an X direction shown in FIG. 1) and the second direction (a Y direction shown in FIG. 1) intersect with each other, and perpendicular to the third direction (a Z direction shown in FIG. 2). Such an arrangement may cause the channel structures 23 to be arranged more compact, so that the arrangement mode is better. Therefore, the arrangement number of the channel structures 23 is maximized, and the storage density of the semiconductor structure is enhanced.

Two ends of each channel structure 23 are respectively provided with a source and a drain. An active column is formed by the source, the channel structure 23, and the drain. The source, the channel structure 23, and the drain are successively stacked in the third direction. That is to say, an extending direction of the active column is the third direction. A shape of the active column may be a cylinder, a prism, a cuboid, or other shapes. The third direction is parallel to a direction of the substrate 10. That is to say, the extending direction of the active column is parallel to the substrate 10.

The WL structure 2 includes a plurality of WLs spaced apart from each other and extending in the first direction. Lengths of the plurality of WLs vary in steps. The WLs penetrate the device layer and surround the channel structures 23. The WLs are configured to control the conduction between the source and the drain. The BL structure 1 includes a plurality of BLs spaced apart from each other and extending in the second direction. The BLs penetrate the device layer and are electrically connected to the channel structures 23. The channel structures 23 are further electrically connected to storage nodes. The BLs are configured to read data information of the storage nodes.

Specifically, each WL surrounds the plurality of channel structures 23 spaced apart from each other in the first direction. Each BL is connected to first ends of the plurality of channel structures 23 spaced apart from each other in the second direction, and second ends of the channel structures 23 are connected to the storage nodes. Exemplarily, first ends of the channel structures 23 are drains, and the drains are in contact with the BLs. Second ends of the channel structures 23 are sources, and the sources are in contact with the storage nodes. The storage nodes may be capacitors 4.

In the embodiment that the substrate 10 further includes the first connection area and the second connection area, lengths of the WLs located above the first connection area vary in steps, and the lengths of the WLs located above the second connection area vary in steps.

Parts of the WLs are located in the device area and extend to the first connection area, and the remaining parts of the WLs are located in the device area and extend to the second connection area. The WLs located in the device area are used as gates. Dielectric layers are further arranged between the WLs and the channel structures 23. Transistors 3 are formed by the gates, the sources, the drains, the channel structures 23, and the dielectric layers. The transistors 3 are Gate All Around (GAA) transistors. Compared with a planar transistor, feature sizes of the GAA transistors are smaller, in a case that a same substrate 10 area is occupied, the integration level of the semiconductor structure can be effectively enhanced, and storage capacity can be increased.

The lengths of the plurality of WLs located above the first connection area vary in steps, such that the parts of the WLs form steps in the second direction. The lengths of the plurality of WLs located above the second connection area vary in steps, such that the parts form steps in the second direction. Portions of the WLs located above the first connection area and the second connection area are used as gate leading-out ends, so as to connect to the peripheral circuit.

In some possible examples, each WL located above the first connection area surrounds the first active layer 31. The first active layer 31 may be used as a supporting layer of the WL, so as to form the WL. A first insulation layer is arranged between the WL on the first connection area and the first active layer 31. Each WL located above the second connection area surrounds the second active layer 41. The second active layer 41 may be used as a supporting layer of the WL, so as to form the WL. A second insulation layer is arranged between the WL on the second connection area and the second active layer 41.

It is to be noted that, the memory further includes a plurality of supporting layers and an isolation layer. The plurality of supporting layers are arranged between the adjacent transistors 3 in the second direction. The isolation layer is filled among the WLs. By arranging the supporting layers, in an aspect, the transistors 3 are conveniently stacked in the second direction, and in another aspect, an electrical isolation between the adjacent transistors 3 may be achieved. By arranging the isolation layer, the electrical isolation between the adjacent transistors 3 may be achieved, so that mutual interference between the transistors 3 is avoided.

In some possible embodiments, the memory further includes a plurality of contact plugs spaced apart from each other. The contact plugs are in one-to-one correspondence with and electrically connected to the WLs, to connect the WLs to the peripheral circuit. The contact plugs include a plurality of first contact plugs 70 located in the first connection area and a plurality of second contact plugs 80 located in the second connection area. The plurality of first contact plugs 70 and the plurality of second contact plugs 80 extend in the second direction. Lengths of the plurality of first contact plugs 70 and lengths of the plurality of second contact plugs 80 vary in steps. Through such an arrangement, the lengths of the plurality of first contact plugs 70 are approximately the same as the lengths of the plurality of second contact plugs 80. A path between the peripheral circuit and each WL is approximately the same. Therefore, a difference in the working condition of each transistor in the device area is relatively small.

To sum up, in the memory provided in the embodiments of the disclosure, the device layer is arranged above the device area of the substrate 10 and includes the plurality of channel structures 23 spaced apart from each other. The plurality of BLs are spaced apart from each other and extend in the second direction. The BLs penetrate the device layer, and are electrically connected to the channel structures 23. The channel structures 23 are further electrically connected to storage nodes. The plurality of WLs are spaced apart from each other and extend in the first direction, and lengths of the WLs vary in steps. The WLs penetrate the device layer, and are electrically connected to the channel structures 23. By forming the WLs that vary in steps, the WLs are led out, so that the WLs are conveniently manufactured, and other structures are also conveniently formed on the WLs, thereby achieving an electrical connection between the WLs and a peripheral circuit.

Figure 3:
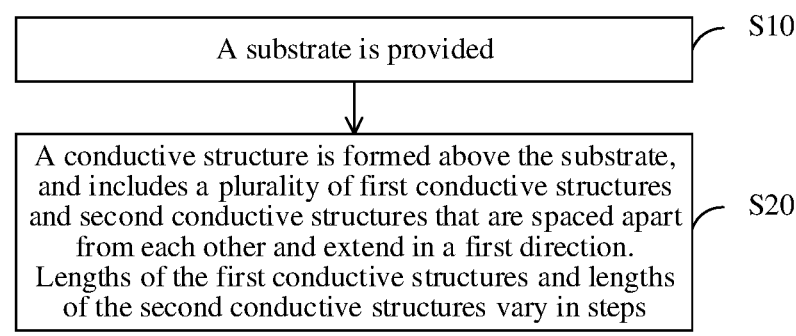
FIG. 3 is a flowchart of a method for manufacturing a semiconductor structure according to an embodiment of the disclosure.

Referring to FIG. 3, an embodiment of the disclosure further provides a method for manufacturing a semiconductor structure. The method includes the following steps.

At S10, a substrate is provided.

Figure 4:
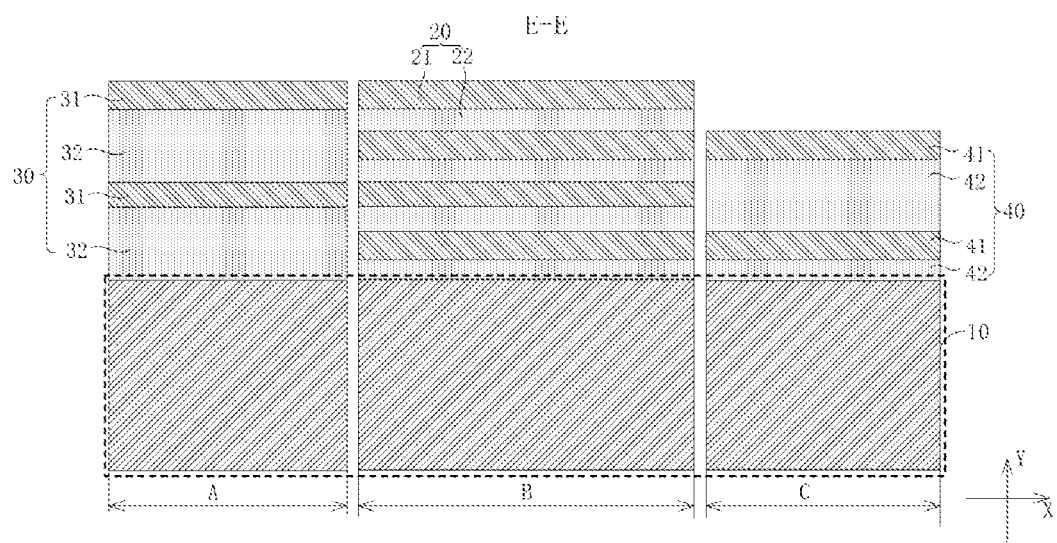
FIG. 4 is a schematic diagram of a structure after forming a first laminated structure, a second laminated structure, and a third laminated structure according to an embodiment of the disclosure.

Referring to FIG. 4, a material of the substrate 10 may be a semiconductor substrate. For example, the material of the substrate 10 may be monocrystalline silicon, polycrystalline silicon, amorphous silicon, germanium, silicon carbide, silicon germanium, a GOI, or an SOI. In some possible embodiments, the substrate 10 includes a device area, and a first connection area and a second connection area that are respectively arranged on two sides of the device area. A semiconductor device, for example, a transistor, is arranged in the device area. Both the first connection area and the second connection area are configured to lead out the semiconductor device in the device area, so that the semiconductor device is electrically connected to the peripheral circuit.

Exemplarily, the first connection area (shown at A in FIG. 4), the device area (shown at B in FIG. 4), and the second connection area (shown at C in FIG. 4) are successively arranged in the first direction. The first direction is a horizontal direction (X direction) shown in FIG. 1. The first connection area is located on a left side of the device area, and the second connection area is located on a right side of the device area. The substrate 10 in the device area, the substrate 10 in the first connection area, and the substrate 10 in the second connection area may be integrated, or may be spaced apart from each other. For example, there is a gap between at least one of the substrate 10 in the first connection area and the substrate 10 in the second connection area and the substrate 10 in the device area. Preferably, the substrate 10 in the first connection area, the substrate 10 in the second connection area, and the substrate 10 in the device area are spaced apart from each other, so that the substrate 10 is provided, and required structures are respectively formed on the substrate 10.

At S20, a conductive structure is formed above the substrate, and includes a plurality of first conductive structures and second conductive structures that are spaced apart from each other and extend in a first direction. Lengths of the first conductive structures and lengths of the second conductive structures vary in steps.

Referring to FIG. 5 to FIG. 8, the plurality of first conductive structures 50 and the plurality of second conductive structures 60 are stacked in the second direction; and the plurality of first conductive structures 50 are spaced apart from each other, the plurality of second conductive structures 60 are spaced apart from each other, and the first conductive structures 50 and the second conductive structures 60 are spaced apart from each other, so that insulated isolation between each first conductive structure 50 and each second conductive structure 60 is guaranteed. The second direction may intersect with the first direction. Preferably, the second direction is perpendicular to the first direction, so that the plurality of first conductive structures 50 and the plurality of second conductive structures 60 are arranged more tightly. Exemplarily, the first direction is a direction (an X direction shown in FIG. 8) parallel to the substrate 10, and the second direction is a direction (a Y direction shown in FIG. 8) perpendicular to the substrate 10.

The plurality of first conductive structures 50 and the plurality of second conductive structures 60 are successively and alternately arranged and spaced apart from each other in the second direction. That is to say, one second conductive structure 60 is arranged between every two adjacent first conductive structures 50, or one first conductive structure 50 is arranged between every two adjacent second conductive structures 60. Through such an arrangement, in the second direction, a distance between two adjacent first conductive structures 50 approximately same as a distance between two adjacent second conductive structures 60, so that the leading-out ends of the first conductive structures 50 and the leading-out ends of the second conductive structures 60 are distributed more uniformly. In this way, the first conductive structures 50 are approximately symmetrical to the second conductive structures 60, so as to fully utilize the space above the substrate 10.

The plurality of first conductive structures 50 extend in the first direction, and the lengths of the plurality of first conductive structures 50 vary in steps. The plurality of second conductive structures 60 extend in the first direction, and lengths of the plurality of second conductive structures 60 vary in steps. Through such an arrangement, each first conductive structure 50 and each second conductive structure 60 are partially exposed, so that each first conductive structure 50 and each second conductive structure 60 are conveniently led out to connect to the peripheral circuit.

Specifically, the first conductive structures 50 are located above the device area and extend to the first connection area, and the second conductive structures 60 are located above the device area and extend to the second connection area. The lengths of the first conductive structures 50 located above the first connection area vary in steps, and the lengths of the second conductive structures 60 located above the second connection area vary in steps. That is to say, the first conductive structures 50 are arranged above the device area and above the first connection area. The second conductive structures 60 are arranged above the device area and above the second connection area. The lengths of the first conductive structures 50 located above the first connection area vary in steps, so that the first conductive structures 50 located above the first connection area form first steps, and the first conductive structures 50 are led out by means of step surfaces of the first steps. The lengths of the second conductive structures 60 located above the second connection area vary in steps, so that the second conductive structures 60 located above the second connection area form second steps, and the second conductive structures 60 are led out by means of step surfaces of the second steps.

In a specific implementation, the step (S20) of forming the conductive structure on the substrate 10 includes the following steps.

At S21, a first laminated structure, a second laminated structure, and a third laminated structure are respectively formed in the device area, the first connection area, and the second connection area of the substrate. The first laminated structure includes first sacrificial layers and device layers that are alternately stacked. The second laminated structure includes second sacrificial layers and first active layers that are alternately stacked. The third laminated structure includes third sacrificial layers and second active layers that are alternately stacked. A plurality of first active layer are in one-to-one correspondence with the device layers of a first portion. A plurality of second active layers are in one-to-one correspondence with the device layers of a second portion.

As shown in FIG. 4, the first laminated structure 20 is formed in the device area of the substrate 10. The second laminated structure 30 is formed in the first connection area of the substrate 10. The third laminated structure 40 is formed in the second connection area of the substrate 10. The first laminated structure 20 includes a plurality of first sacrificial layers 22 and a plurality of device layers 21. The first sacrificial layers 22 and the device layers 21 are successively stacked in the second direction. The second laminated structure 30 includes a plurality of second sacrificial layers 32 and a plurality of first active layers 31. The second sacrificial layers 32 and the first active layers 31 are successively stacked in the second direction. The third laminated structure 40 includes a plurality of third sacrificial layers 42 and a plurality of second active layers 41. The third sacrificial layers 42 and the second active layers 41 are successively stacked in the second direction.

The plurality of first active layers 31 are in one-to-one correspondence with the device layers 21 of a first portion. The plurality of second active layers 41 are in one-to-one correspondence with the device layers 21 of a second portion. Preferably, the plurality of first active layers 31 and the device layers 21 at odd layers correspond to each other and are arranged at a same layer. The plurality of second active layers 41 and the device layers 21 at even layers correspond to each other and are arranged at a same layer. Through such an arrangement, a distance between the adjacent first active layers 31 in the second direction is approximately the same as a distance between the adjacent second active layers 41 in the second direction, so that a structure above the first connection area and a structure above the second connection area are more uniform in distribution, which are approximately symmetrical to each other. Therefore, space can be fully utilized.

In some possible examples, the first sacrificial layers 22 are located on the outermost side of the first laminated structure 20 close to the substrate 10. That is to say, the first sacrificial layers 22 are located on the substrate 10. Through such an arrangement, each device layer 21 may subsequently form a transistor 3, so that the number of the transistors 3 is increased, thereby enhancing the storage density of the semiconductor structure. Correspondingly, the second sacrificial layers 32 and the third sacrificial layers 42 are also located on the substrate 10.

A material of the first active layers 31 includes N-doped silicon. A material of the first sacrificial layers 22 includes silicon germanium. The first active layers 31, the second active layers 41, and third active layers have a same material. The first sacrificial layers 22, the second sacrificial layers 32, and the third sacrificial layers 42 have a same material. The first active layers 31, the second active layers 41, the third active layers, the first sacrificial layers 22, the second sacrificial layers 32, and the third sacrificial layers 42 may be formed by means of a deposition process.

At S22, the first sacrificial layer and parts of the device layers are removed, such that each device layer forms a plurality of channel structures spaced apart from each other.

Figure 5:
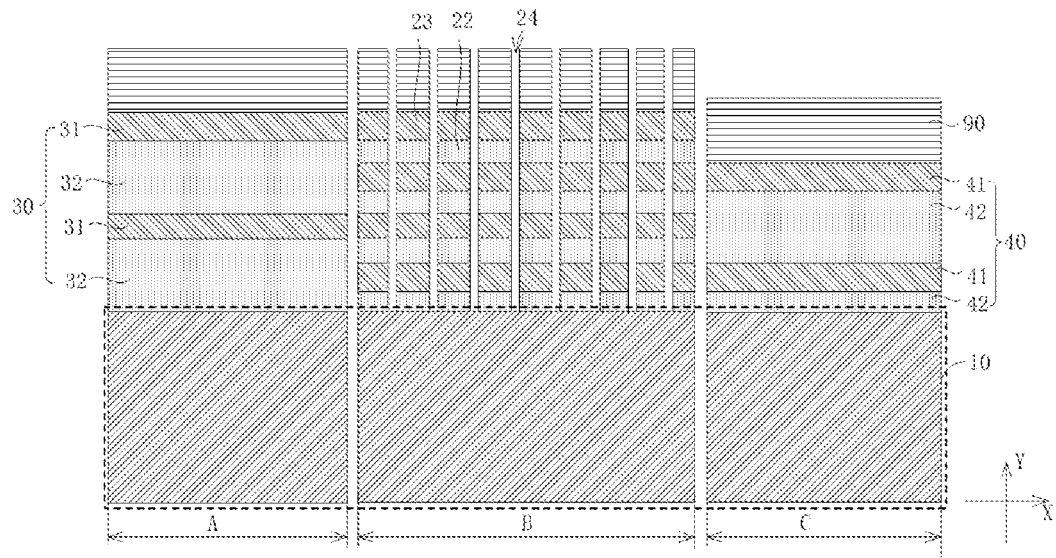
FIG. 5 is a schematic diagram of a structure after forming a first groove according to an embodiment of the disclosure.

Referring to FIG. 4 and FIG. 5, the plurality of channel structures 23 are arranged in arrays. The plurality of channel structures 23 are not only spaced in the first direction, but also spaced in the second direction, and extend in a third direction. The first direction and the second direction intersect with each other, and perpendicular to the third direction. Such an arrangement may cause the channel structures 23 to be arranged more compact, so that the arrangement mode is better. Therefore, the arrangement number of the channel structures 23 is maximized, and the storage density of the semiconductor structure is enhanced.

A source and a drain respectively located on two ends of each channel structure 23 are formed on the device layer 21. An active column is formed by the source, the channel structure 23, and the drain. The source, the channel structure 23, and the drain are successively stacked in the third direction. That is to say, an extending direction of the active column is the third direction. A shape of the active column may be a cylinder, a prism, a cuboid, or other shapes. The third direction is parallel to a direction of the substrate 10. That is to say, the extending direction of the active column is parallel to the substrate 10.

Figure 6:
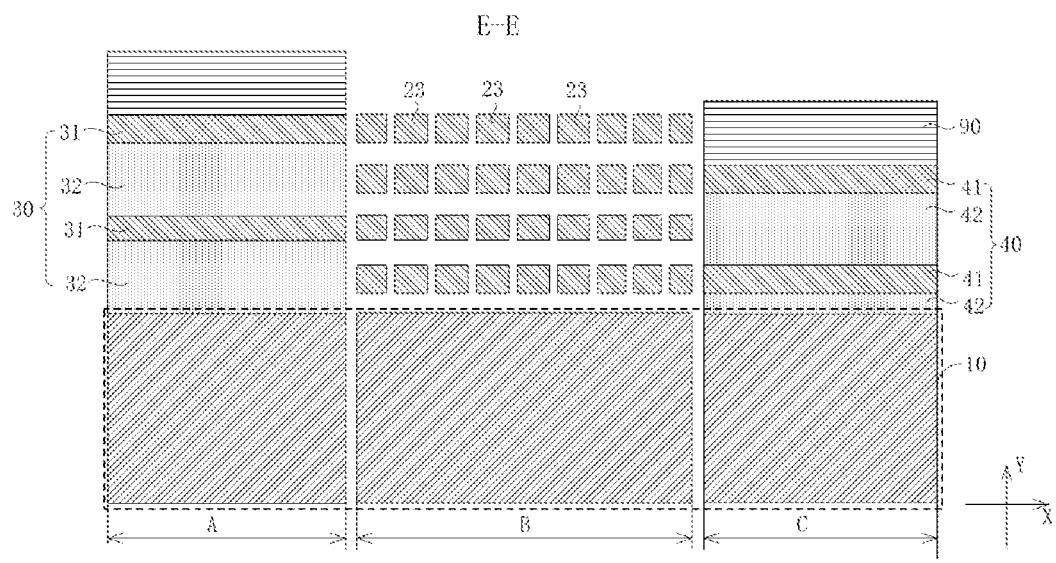
FIG. 6 is a schematic diagram of a structure after forming a channel structure according to an embodiment of the disclosure.

In some possible implementations, referring to FIG. 5 and FIG. 6, the step of removing the first sacrificial layers 22 and parts of the device layers 21, such that each device layer 21 forms a plurality of channel structures 23 spaced apart from each other includes the following operation.

A plurality of first grooves 24 spaced apart from each other and extending in the third direction are formed in the first laminated structure 20. The first grooves 24 are exposed from the substrate 10. Each device layer 21 is separated into a plurality of active columns spaced apart from each other. The active columns include channel structures 23. Specifically, as shown in FIG. 5, a mask layer 90 is first formed on the first laminated structure 20, the second laminated structure 30, and the third laminated structure 40. The mask layer 90 on the first laminated structure 20 has a first pattern, and the first pattern is exposed from partial surface of the first laminated structure 20. The mask layer 90 may be a photoresist. Then, by using the mask layer 90 as a mask, the first laminated structure 20 is etched to form the first grooves 24. After the first grooves 24 are formed, the mask layer 90 on the first laminated structure 20 is removed.

After the first grooves 24 are formed, the first grooves 24 are utilized to remove the first sacrificial layers 22, so that there is a gap between the active columns arranged at different layers. Specifically, as shown in FIG. 6, the first sacrificial layers 22 exposed in the first grooves 24 are etched by using a selective wet etching process, to completely remove the first sacrificial layers 22. The second sacrificial layers 32 and the third sacrificial layers 42 are not removed or less removed. After the first sacrificial layers 22 are removed, the mask layer 90 on the second laminated structure 30 and the third laminated structure 40 are removed.

At S23, parts of the first active layers away from the channel structures and parts of the second active layers are removed, such that lengths of the remaining first active layers and the second active layers vary in steps.

Figure 7:
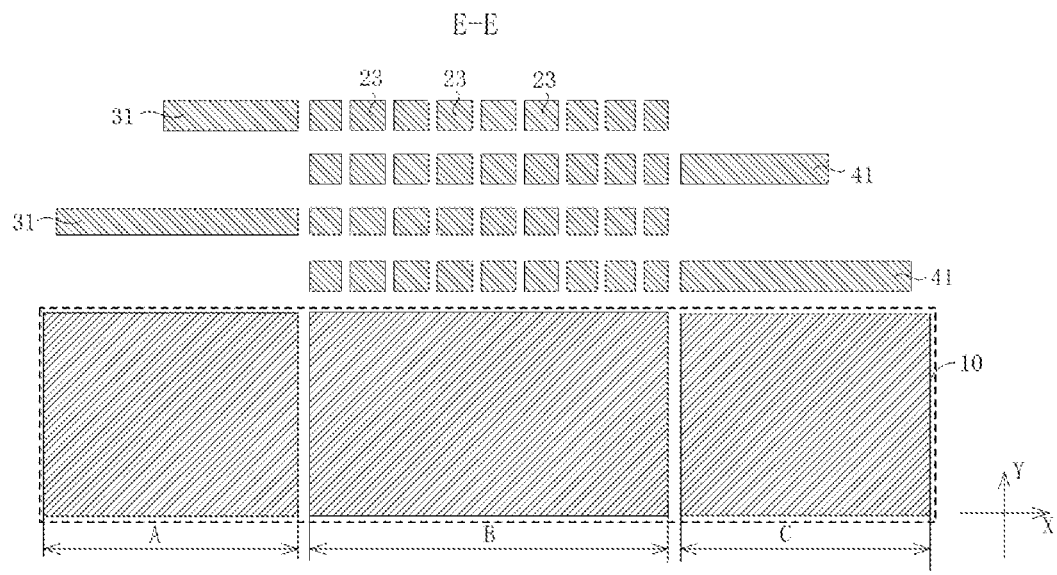
FIG. 7 is a schematic diagram of a structure after removing part of a first active layer and part of a second active layer according to an embodiment of the disclosure.

Referring to FIG. 6 and FIG. 7, the second sacrificial layers 32 and parts of the first active layers 31 away from the channel structures 23 are removed. The lengths of the remaining first active layers 31 vary in steps to form steps, so that partial surface of each first active layer 31 is exposed, and other structures are conveniently formed. The third sacrificial layers 42 and parts of the second active layers 41 away from the channel structures 23 are removed. The lengths of the remaining second active layers 41 vary in steps to form steps, so that partial surface of each second active layer 41 is exposed, and other structures are conveniently formed.

At S24, first conductive structures are formed on the first active layers and the channel structures corresponding to the first active layers, and second conductive structures are formed on the second active layers and the channel structures corresponding to the second active layers.

Figure 8:
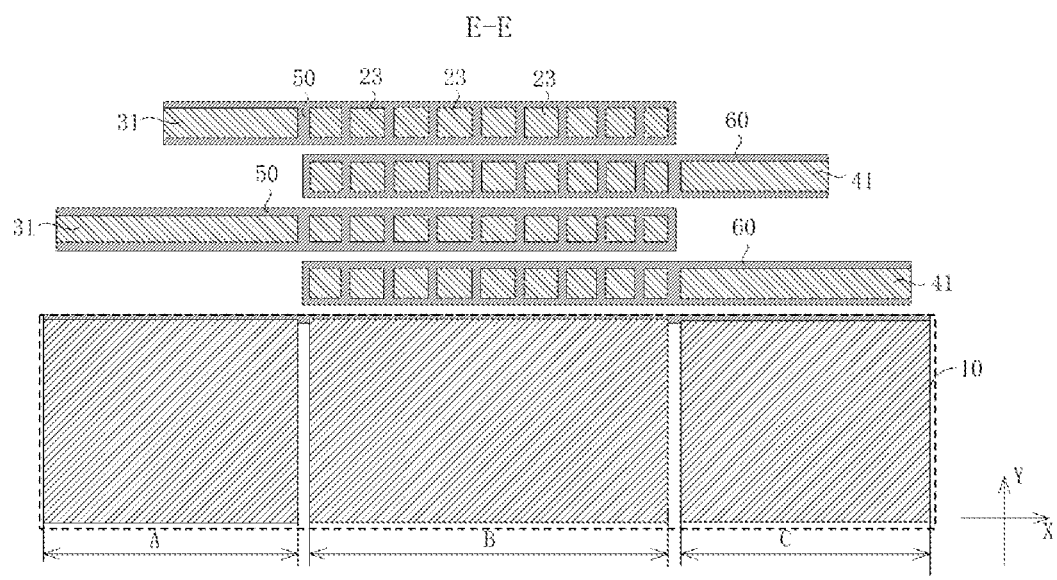
FIG. 8 is a schematic diagram of a structure after forming a first conductive structure and a second conductive structure according to an embodiment of the disclosure.

Referring to FIG. 7 and FIG. 8, after a first conductive layer and a second conductive layer are formed, the lengths of a plurality of first conductive structures 50 and the lengths of a plurality of second conductive structures 60 vary in steps. Specifically, the lengths of the first conductive structures 50 close to the substrate 10 is greater than the lengths of the first conductive structures 50 away from the substrate 10, such that the lengths of the plurality of first conductive structures 50 vary in steps. The lengths of the second conductive structures 60 close to the substrate 10 is greater than the lengths of the second conductive structures 60 away from the substrate 10, such that the lengths of the plurality of second conductive structures 60 vary in steps.

In some possible embodiments, before the first conductive structures 50 are formed on the first active layers 31 and the channel structures 23 corresponding to the first active layers, and the second conductive structures 60 are formed on the second active layers 41 and the channel structures 23 corresponding to the second active layers (S24), the method further includes: depositing an insulation material on the first active layers 31, the second active layers 41, and the channel structures 23. The insulation material located on the first active layers 31 forms a first insulation layer, the insulation material located on the channel structures 23 forms a dielectric layer, and the insulation material located on the second active layers 41 forms a second insulation layer. The first insulation layer, the dielectric layer, and the second insulation layer are spaced apart from each other.

That is to say, before the first conductive structures 50 and the second conductive structures 60 are formed, the dielectric layers are formed on surfaces of the channel structures 23, to guarantee insulation between the channel structures 23 and the first conductive structures 50 and the second conductive structures 60. In addition, the first insulation layers are formed on surfaces of the first active layers 31. The second insulation layers are formed on surfaces of the second active layers 41. The dielectric layers, the first insulation layers, and the second insulation layers are simultaneously formed, to guarantee the respective flatness of the first conductive structures 50 and the second conductive structures 60.

The surfaces of the channel structures 23 are outer peripheral surfaces of the channel structures 23. The dielectric layers surround the channel structures 23. The surfaces of the first active layers 31 may be outer peripheral surfaces of the first active layers 31, or may be two opposite surfaces of the first active layers 31 in the second direction, and surfaces facing the channel structures 23. That is to say, the first insulation layers cover at least two opposite surfaces of the first active layers 31 in the second direction, and the surfaces facing the channel structures 23. The surfaces of the second active layers 41 may be outer peripheral surfaces of the second active layers 41, or may be two opposite surfaces of the second active layers 41 in the second direction, and surfaces facing the channel structures 23. That is to say, the second insulation layers cover at least two opposite surfaces of the second active layers 41 in the second direction, and the surfaces facing the channel structures 23.

After the first insulation layers, the dielectric layers, and the second insulation layers are formed, conductive materials are deposited on the first insulation layers, the dielectric layers, and the second insulation layers. The conductive materials on the first insulation layers and parts of the dielectric layers form the first conductive structures 50, and the conductive materials on the second insulation layers and the other parts of the dielectric layers form the second conductive structures 60.

Specifically, the first conductive structures 50 and the second conductive structures 60 are used as WLs. Each first conductive structure 50 covers the corresponding first insulation layer and the dielectric layer arranged at the same layer with the first insulation layer, and is filled between the dielectric layers, and between the dielectric layer and the first insulation layer. Each second conductive structure 60 covers the corresponding second insulation layer and the dielectric layer arranged at the same layer with the second insulation layer, and is filled between the dielectric layers, and between the dielectric layer and the second insulation layer. The first conductive structures 50 and the second conductive structure 60 covering the dielectric layers form the gates, and the gates are a part of the WLs. The first conductive structures 50 covering the first insulation layer and the second conductive structure 60 covering the second insulation layer are used as gate leading-out ends to connect the peripheral circuit.

In some possible embodiments, after the conductive structure is formed on the substrate 10, the method further includes: forming a plurality of contact plugs spaced apart from each other. The contact plugs include first contact plugs 70 and second contact plugs 80. A plurality of first contact plugs 70 are in one-to-one correspondence with and electrically connected to the plurality of first conductive structures 50. A plurality of second contact plugs 80 are in one-to-one correspondence with and electrically connected to the plurality of second conductive structures 60. Lengths of the plurality of first contact plugs 70 and the plurality of second contact plugs 80 vary in steps.

The plurality of contact plugs are configured to electrically connect the first conductive structures 50 and the second conductive structures 60 to the peripheral circuit. The plurality of contact plugs are spaced apart from each other, to guarantee insulated isolation among the plurality of contact plugs. Therefore, mutual interference between the first conductive structures 50 or between the second conductive structures 60 is avoided.

The number of the first contact plugs 70 matches the number of the first conductive structures 50, so that the plurality of first contact plugs 70 are in one-to-one correspondence with and electrically connected to the plurality of first conductive structures 50. Therefore, each first conductive structure 50 may be electrically connected to the peripheral circuit, and the transistor corresponding to the first conductive structure 50 is controlled by using the peripheral circuit. The number of the second contact plugs 80 matches the number of the second conductive structures 60, so that the plurality of second contact plugs 80 are in one-to-one correspondence with and electrically connected to the plurality of second conductive structures 60. Therefore, each second conductive structure 60 may be electrically connected to the peripheral circuit, and the transistor corresponding to the second conductive structure 60 is controlled by using the peripheral circuit.

The plurality of first contact plugs 70 may be arranged in the first direction, and the plurality of second contact plugs 80 may be arranged in the first direction. Through such an arrangement, the plurality of first contact plugs 70 and the plurality of second contact plugs 80 are smaller in space occupation, so that the number of transistors are increased, thereby increasing the storage density of the semiconductor structure. Preferably, the plurality of first contact plugs 70 and the plurality of second contact plugs 80 are located in a same row in the first direction, to further reduce space occupied by the plurality of first contact plugs 70 and the plurality of second contact plugs 80.

The lengths of the plurality of first contact plugs 70 vary in steps, and the lengths of the plurality of second contact plugs 80 vary in steps. A length direction is the second direction. Through such an arrangement, the lengths of the plurality of first contact plugs 70 are approximately the same as the lengths of the plurality of second contact plugs 80. A path between the peripheral circuit and the first conductive structure 50, and between the peripheral circuit and the second conductive structure 60 are approximately the same. Therefore, a difference in the working condition of each transistor in the device area is relatively small.

The first contact plugs 70 and the second contact plugs 80 include first conductive portions and second conductive portions arranged on the first conductive portions, and sizes of the first conductive portions are less than sizes of the second conductive portions. The first conductive portions are portions close to the substrate 10, and the second conductive portions are portions away from the substrate 10. That is to say, the second conductive portions are located on sides of the first conductive portions away from the substrate 10. The sizes of the first conductive portions may refer to diameters or cross-sectional areas of the first conductive portions. The sizes of the second conductive portions may refer to diameters or cross-sectional areas of the second conductive portions. As shown in FIG. 1, orthographic projections of the second conductive portions on the substrate 10 cover orthographic projections of the first conductive portions on the substrate 10.

The first conductive portions and the second conductive portions may include core layers and outer layers covering side surfaces and bottom surfaces of the core layers. The core layers may be insulation layers, and a material of the core layers may be silicon nitride or silicon oxide. The outer layers may be metal layers, and a material of the outer layers may be tungsten or titanium nitride. Through such an arrangement, on the basis of guaranteeing the electric performance of the first conductive portions and the second conductive portions, thicknesses of the metal layers are decreased, so as to reduce costs.

To sum up, in the method for manufacturing a semiconductor structure provided in the embodiments of the disclosure, the conductive structure is formed above the substrate 10, and includes the plurality of first conductive structures 50 and second conductive structures 60 that are spaced apart from each other and extend in the first direction. The lengths of the plurality of first conductive structures 50 and the lengths of the plurality of second conductive structures 60 vary in steps. The first conductive structures 50 and the second conductive structures 60 form WLs. The WLs are easy to manufacture and lead out, so that other structures are conveniently formed on the WLs, so as to achieve an electrical connection between the WLs and a peripheral circuit.

The method for manufacturing a semiconductor structure provided in the embodiments of the disclosure has at least the following advantages. In the method for manufacturing a semiconductor structure provided in the embodiments of the disclosure, the conductive structure is formed above the substrate, and includes the plurality of first conductive structures and second conductive structures that are spaced apart from each other and extend in the first direction. The lengths of the plurality of first conductive structures vary in steps and the lengths of the plurality of second conductive structures vary in steps. The first conductive structures and the second conductive structures form WLs. The WLs are easy to manufacture and lead out, so that other structures are conveniently formed on the WLs, so as to achieve an electrical connection between the WLs and a peripheral circuit.

The embodiments or implementations in this specification are described in a progressive manner. Each embodiment focuses on the differences from other embodiments, and the same and similar parts of the various embodiments may be referred to each other. Descriptions of the terms "an embodiment," "some embodiments," "exemplary implementation," "example," "specific example," or "some examples", mean that specific features, structures, materials, or characteristics described with reference to the implementations or examples are included in at least one implementation or example of the disclosure. In this specification, schematic representations of the above terms do not necessarily refer to the same implementation or example. In addition, the described particular features, structures, materials or characteristics may be combined in any suitable manner in any one or more implementations or examples.

It is to be noted at last: the above various embodiments are only used to illustrate the technical solutions of the disclosure and not used to limit the same. Although the disclosure has been described in detail with reference to the foregoing embodiments, for those of ordinary skill in the art, they can still modify the technical solutions described in the foregoing embodiments, or equivalently replace part or all of the technical features; all these modifications and replacements shall not cause the essence of the corresponding technical solutions to depart from the scope of the technical solutions of the embodiments of the disclosure.

What is claimed is:

1. A semiconductor structure, comprising:
   a substrate and a conductive structure located above the substrate, wherein
   the substrate comprises a device area, a first connection area and a second connection area that are respectively arranged on two sides of the device area;
   the conductive structure comprises a plurality of first conductive structures and second conductive structures that are spaced apart from each other and extend in a first direction; and lengths of the first conductive structures vary in steps and lengths of the second conductive structures vary in steps;
   the first conductive structures are located above the device area and extend to the first connection area, and the second conductive structures are located above the device area and extend to the second connection area; and the lengths of the first conductive structures located above the first connection area vary in steps, and the lengths of the second conductive structures located above the second connection area vary in steps;
   wherein each first conductive structure and each second conductive structure above the device area surround a plurality of channel structures spaced apart from each other; and dielectric layers are arranged between the first conductive structure and the channel structures, and between the second conductive structure and the channel structures;
   wherein each first conductive structure above the first connection area surrounds a first active layer, and a first insulation layer is arranged between the first conductive structure and the first active layer;
   each second conductive structure above the second connection area surrounds a second active layer, and a second insulation layer is arranged between the second conductive structure and the second active layer;
   wherein the first active layer and the plurality of channel structures corresponding to a same first conductive structure are arranged at a same layer; and the second active layer and the plurality of channel structures corresponding to a same second conductive structure are arranged at a same layer.

2. The semiconductor structure of claim 1, wherein the lengths of the first conductive structures close to the substrate are greater than the lengths of the first conductive structures away from the substrate, such that the lengths of the plurality of first conductive structures vary in steps; and
   the lengths of the second conductive structures close to the substrate are greater than the lengths of the second conductive structures away from the substrate, the lengths of the plurality of second conductive structures vary in steps.

3. The semiconductor structure of claim 1, wherein the plurality of first conductive structures and the plurality of second conductive structures are alternately arranged and spaced apart from each other in a second direction.

4. The semiconductor structure of claim 1, further comprising: a plurality of contact plugs spaced apart from each other, wherein the contact plugs comprise first contact plugs and second contact plugs;
   a plurality of first contact plugs are in one-to-one correspondence with and electrically connected to the plurality of first conductive structures; and a plurality of second contact plugs are in one-to-one correspondence with and electrically connected to the plurality of second conductive structures.

5. The semiconductor structure of claim 4, wherein the plurality of first contact plugs and the plurality of second contact plugs extend in a second direction; and lengths of the plurality of first contact plugs and lengths of the plurality of second contact plugs vary in steps.

6. The semiconductor structure of claim 4, wherein the first contact plugs and the second contact plugs comprise first conductive portions and second conductive portions arranged on the first conductive portions; and sizes of the first conductive portions are less than sizes of the second conductive portions.

7. A memory, comprising:
   a substrate, comprising a device area, a first connection area and a second connection area; the device area is located between the first connection area and the second connection area;
   a device layer, located above the device area, and comprising a plurality of channel structures spaced apart from each other;
   a Word Line (WL) structure, comprising a plurality of WLs spaced apart from each other and extending in a first direction, wherein lengths of the plurality of WLs vary in steps;
   a Bit Line (BL) structure, comprising a plurality of BLs spaced apart from each other and extending in a second direction, wherein
   the WLs penetrate the device layer and surround the channel structures; the BLs penetrate the device layer and are electrically connected to the channel structures; and the channel structures are further electrically connected to storage nodes;
   the lengths of the plurality of WLs located above the first connection area vary in steps; and the lengths of the plurality of WLs located above the second connection area vary in steps;
   wherein each WLs above the first connection area surrounds a first active layer; each WLs above the second connection area surrounds a second active layer;
   wherein the first active layer and the plurality of channel structures corresponding to a same WLs are arranged at a same layer; and the second active layer and the plurality of channel structures corresponding to a same WLs are arranged at a same layer.

8. The memory of claim 7, wherein each BL is connected to first ends of the plurality of channel structures spaced apart from each other in the second direction, and second ends of the channel structures are connected to the storage nodes.

9. A method for manufacturing a semiconductor structure, comprising:
providing a substrate;
the substrate comprises a device area, a first connection area and a second connection area that are respectively arranged on two sides of the device area;
forming a conductive structure above the substrate, wherein the conductive structure comprises a plurality of first conductive structures and second conductive structures that are spaced apart from each other and extend in a first direction; and lengths of the first conductive structures vary in steps and lengths of the second conductive structures vary in steps;
the first conductive structures are located above the device area and extend to the first connection area, and the second conductive structures are located above the device area and extend to the second connection area; and the lengths of the first conductive structures located above the first connection area vary in steps, and the lengths of the second conductive structures located above the second connection area vary in steps;
wherein each first conductive structure and each second conductive structure above the device area surround a plurality of channel structures spaced apart from each other; and dielectric layers are arranged between the first conductive structure and the channel structures, and between the second conductive structure and the channel structures;
wherein each first conductive structure above the first connection area surrounds a first active layer, and a first insulation layer is arranged between the first conductive structure and the first active layer;
each second conductive structure above the second connection area surrounds a second active layer, and a second insulation layer is arranged between the second conductive structure and the second active layer;
wherein the first active layer and the plurality of channel structures corresponding to a same first conductive structure are arranged at a same layer; and the second active layer and the plurality of channel structures corresponding to a same second conductive structure are arranged at a same layer.

10. The manufacturing method of claim 9, wherein the forming a conductive structure above the substrate comprises:
respectively forming a first laminated structure, a second laminated structure, and a third laminated structure in the device area, the first connection area, and the second connection area of the substrate, wherein the first laminated structure comprises first sacrificial layers and device layers that are alternately stacked, the second laminated structure comprises second sacrificial layers and first active layers that are alternately stacked, the third laminated structure comprises third sacrificial layers and second active layers that are alternately stacked, a plurality of first active layer are in one-to-one correspondence with the device layers of a first portion, and a plurality of second active layers are in one-to-one correspondence with the device layers of a second portion;
removing the first sacrificial layer and parts of the device layers, such that each device layer forms a plurality of channel structures spaced apart from each other;
removing parts of the first active layers and parts of the second active layers away from the channel structures, such that lengths of the remaining first active layers and the second active layers vary in steps; and
forming a first conductive structure on the first active layers and the channel structures corresponding to the first active layers, and forming a second conductive structure on the second active layers and the channel structures corresponding to the second active layers.

11. The manufacturing method of claim 10, wherein the plurality of first active layers and the device layers at odd layers correspond to each other and are arranged at a same layer, and the plurality of second active layers and the device layers at even layers correspond to each other and are arranged at a same layer.

12. The manufacturing method of claim 10, wherein before forming the first conductive structure on the first active layers and the channel structures corresponding to the first active layers, and forming the second conductive structure on the second active layers and the channel structures corresponding to the second active layers, the manufacturing method further comprises:
depositing an insulation material on the first active layers, the second active layers, and the channel structures, wherein the insulation material located on the first active layers forms a first insulation layer, the insulation material located on the channel structures forms a dielectric layer, the insulation material located on the second active layers forms a second insulation layer, and the first insulation layer, the dielectric layer, and the second insulation layer are spaced apart from each other.

13. The manufacturing method of claim 9, wherein after forming the conductive structure above the substrate, the manufacturing method further comprises:
forming a plurality of contact plugs spaced apart from each other, wherein the contact plugs comprise first contact plugs and second contact plugs; a plurality of first contact plugs are in one-to-one correspondence with and electrically connected to the plurality of first conductive structures; a plurality of second contact plugs are in one-to-one correspondence with and electrically connected to the plurality of second conductive structures; lengths of the plurality of second contact plugs vary in steps and the plurality of first contact plugs vary in steps.

* * * * *